United States Patent
Kimura et al.

(10) Patent No.: US 6,700,383 B2
(45) Date of Patent: Mar. 2, 2004

(54) METHOD OF DETECTING AND RESOLVING MEMORY EFFECT

(75) Inventors: Tadao Kimura, Kobe (JP); Masayoshi Toyota, Toyohashi (JP); Norito Yamabe, Toyohashi (JP); Yusai Murakami, Hamamatsu (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 23 days.

(21) Appl. No.: 10/174,204

(22) Filed: Jun. 17, 2002

(65) Prior Publication Data

US 2002/0195999 A1 Dec. 26, 2002

(30) Foreign Application Priority Data

Jun. 20, 2001 (JP) ........................................ 2001-186187

(51) Int. Cl.[7] ........................... G01N 27/416; H02J 7/00
(52) U.S. Cl. ........................................ 324/429; 320/131
(58) Field of Search ................................ 324/429, 104, 324/106, 428, 431; 320/131, 130, 132, 150, 152, 133; 702/63; 340/636.1, 636.11–636.18; 307/10.1, 9.1, 10.7

(56) References Cited

U.S. PATENT DOCUMENTS 5,585,728 A * 12/1996 Champlin .................... 324/427
6,377,028 B1 * 4/2002 Armstrong, II et al. ..... 320/136

FOREIGN PATENT DOCUMENTS

| JP | 7-336906 | 12/1995 |
| JP | 2000-221249 | 8/2000 |
| JP | 2000-348780 | 12/2000 |

* cited by examiner

Primary Examiner—Pia Tibbits
(74) Attorney, Agent, or Firm—Merchant & Gould P.C.

(57) ABSTRACT

A method of detecting and resolving a memory effect capable of detecting the memory effect with ease and with high precision and resolving even when the vehicle is in motion is provided. A current in a secondary battery is detected, a variation $\Delta SOC$ in a residual battery capacity for a predetermined time period is calculated according to at least current integration by multiplying the detected current by a predetermined charge efficiency (S302), a temperature of the secondary battery is detected and a variation $\Delta V$ in a no-load voltage for the predetermined time period is calculated based on the detected current, and an internal resistance corresponding to the detected temperature and the SOC is calculated (S303). A ratio k of the variation in the no-load voltage to the variation in the residual battery capacity is calculated (S304). If the ratio exceeds a predetermined threshold value kst, then the battery is judged to have a memory effect (S307), and the usage range of the SOC is extended for a predetermined time period (S308) or the correction of the SOC using voltages is prohibited for a predetermined time period (S309).

22 Claims, 8 Drawing Sheets

| Initial Charge Efficiency $\eta_0$ (%) | | SOC (%) | | | |
|---|---|---|---|---|---|
| | | 20 | 40 | 60 | 80 |
| Temperature (°C) | 20 | 99 | 99 | 99 | 98 |
| | 30 | 99 | 99 | 98 | 97 |
| | 40 | 99 | 98 | 95 | 92 |
| | 50 | 98 | 95 | 92 | 88 |

METHOD OF DETECTING AND RESOLVING MEMORY EFFECT

BACKGROUND OF THE INVENTION

1. Field of the Invention

The present invention relates to a technology for detecting a memory effect generated in a secondary battery such as a nickel-metal hydride secondary battery mounted on an electric vehicle (PEV), a hybrid vehicle (HEV) and the like, and resolving the memory effect.

2. Related Background Art

Secondary batteries include a lead battery, a nickel-cadmium (Ni—Cd) battery, a nickel-metal hydride (Ni-MH) battery, a lithium-ion battery, and the like. These batteries have a characteristic of being charged by connecting to an external power source from which a predetermined current is supplied, as electrical power is consumed. With this characteristic, these batteries have been used for various equipment.

For example, the batteries are mounted on a vehicle and serve as a battery for starting an engine, which supplies electrical power to a spark plug of the engine at the time of starting the engine. Recently, Ni-MH batteries are used also for a main power source for driving a motor of an electric vehicle (PEV) and a so-called hybrid vehicle (HEV) provided with an engine and a motor.

For instance, in the case of a secondary battery mounted on the HEV, charge/discharge of the secondary battery might be repeated while the vehicle is in motion. In the HEV, when an output from an engine is larger than a power required for driving the vehicle, then surplus power is used for driving a generator so as to charge a secondary battery. Conversely, when an output from the engine is smaller, then electrical power from the secondary battery is used for driving the motor so as to compensate a shortage of the power. In the latter case, the secondary battery is discharged. Such a repetition of charge and discharge is carried out in accordance with the running state of the vehicle, the state of charge of the battery, and the operation by a driver.

In this way, if a shallow (incomplete) charge and discharge are repeated with respect to the second battery, then a voltage in the last stage of discharge is lowered, which causes decrease in the amount of discharge energy that can be used actually, so that a so-called memory effect occurs. Normally, the effective capacity of a secondary battery whose amount of discharge energy is lowered temporarily due to this memory effect can be recovered by carrying out deep (complete) discharge once. For example, in the case of a Ni-MH battery, the memory effect can be resolved by forcibly discharging it until a voltage of each cell is decreased to 1V.

In order to avoid a decrease in the amount of discharge energy due to this memory effect, generally, a refresh capability of discharging a battery completely before charge is given to a charger, or refresh discharge is carried out automatically according to the number of charges.

However, in a secondary battery system mounted on the HEV, in order to obtain an output required for driving a motor, a plurality of single cells are connected in series to make up an assembled battery, and a voltage, current, and temperature of the battery are monitored so as to repeat charge and discharge in a state of a residual battery capacity (SOC) of the secondary battery within a range of 50% to 70% of the full charged state. In such a system, complete discharge carried out when the vehicle in motion for the purpose of resolving the memory effect might lead to a significant failure of the vehicle such as stopping on the road. Therefore, it is required that after the vehicle is stopped at a charging site and complete discharge is carried out for the secondary battery, then the secondary battery is charged into a full charged state for a predetermined time period.

As stated above, in the case of the HEV, complete charge and discharge cannot be carried out while the vehicle is in motion. Therefore, it is considerably difficult to confirm the generation of the memory effect while the vehicle is in motion. In addition, since the refresh discharge and complete discharge are difficult for the HEV, it also is difficult to resolve the memory effect while the vehicle is in motion.

SUMMARY OF THE INVENTION

Therefore, with the foregoing in mind, it is an object of the present invention to provide a method of detecting and resolving the memory effect, by which generation of the memory effect can be detected with high precision and resolved even when the vehicle is in motion.

To fulfill the above-stated object, a first method for detecting a memory effect according to the present invention includes the steps of detecting a current flowing through a secondary battery configured by combining a plurality of single cells into an assembled battery; performing an operation on a variation in a residual battery capacity for a predetermined time period according to at least current integration by multiplying the detected current by a predetermined charge efficiency; detecting a temperature of the secondary battery; calculating a variation in a no-load voltage for the predetermined time period, based on the detected current and an internal resistance corresponding to the detected temperature and the residual battery capacity obtained by the operation; calculating a ratio of the variation in the no-load voltage to the variation in the residual battery capacity; and if the ratio of the variation in the no-load voltage to the variation in the residual battery capacity is not less than a predetermined threshold value, judging as a memory effect occurring in the secondary battery.

To fulfill the above-stated object, a second method for detecting a memory effect according to the present invention includes the steps of: detecting a current flowing through a secondary battery configured by combining a plurality of single cells into an assembled battery and used in a middle charge state; performing an operation on a variation in a residual battery capacity for a predetermined time period according to at least current integration by multiplying the detected current by a predetermined charge efficiency; detecting a temperature of the secondary battery; calculating a variation in a no-load voltage for the predetermined time period, based on the detected current and an internal resistance corresponding to the detected temperature and the residual battery capacity obtained by the operation; calculating a ratio of the variation in the no-load voltage to the variation in the residual battery capacity; and if the ratio of the variation in the no-load voltage to the variation in the residual battery capacity is not less than a predetermined threshold value, judging as a memory effect occurring in the secondary battery.

In the first and the second detecting methods, it is preferable that the predetermined charge efficiency is determined based on the detected temperature and the residual battery capacity obtained by the current operation.

In addition, in the first and the second detecting methods, it is preferable that the predetermined threshold value is determined based on a level of memory effect intended to be judged.

To fulfill the above-stated object, a first method for resolving a memory effect according to the present invention includes the step of, if the battery is judged to have a memory effect according to the first or the second detecting method, setting a control range of the residual battery capacity broader than a normal usage range.

To fulfill the above-stated object, a second method for resolving a memory effect according to the present invention includes the step of, if the battery is judged to have a memory effect according to the first or the second detecting method, prohibiting correction of a residual battery capacity obtained by the operation based on a voltage variation for a predetermined time period.

To fulfill the above-stated object, a third method for detecting a memory effect according to the present invention includes the steps of: detecting a current flowing through a secondary battery configured by combining a plurality of single cells into an assembled battery; detecting an output voltage from the secondary battery while associating the output voltage with the detected current; calculating a no-load voltage at the detected current being zero, based on a variation in the output voltage with respect to the detected current for a predetermined time period; performing an operation on a residual battery capacity for the predetermined time period according to at least current integration by multiplying the detected current by a predetermined charge efficiency, based on the calculated no-load voltage; calculating a correlation coefficient between the no-load voltage and the residual battery capacity obtained by the operation in a predetermined variation range; and if the correlation coefficient is not more than a predetermined threshold value, judging as a memory effect occurring in the secondary battery.

To fulfill the above-stated object, a fourth method for detecting a memory effect according to the present invention includes the steps of: detecting a current flowing through a secondary battery configured by combining a plurality of single cells into an assembled battery and used in a middle charge state; detecting an output voltage from the secondary battery while associating the output voltage with the detected current; calculating a no-load voltage at the detected current being zero, based on a variation in the output voltage with respect to the detected current for a predetermined time period; performing an operation on a residual battery capacity for the predetermined time period according to at least current integration by multiplying the detected current by a predetermined charge efficiency, based on the calculated no-load voltage; calculating a correlation coefficient between the no-load voltage and the residual battery capacity obtained by the operation in a predetermined variation range; and if the correlation coefficient is not more than a predetermined threshold value, judging as a memory effect occurring in the secondary battery.

In the third and the fourth detecting methods, it is preferable that a temperature of the secondary battery is detected, and the predetermined charge efficiency is determined based on the detected temperature and the residual battery capacity obtained by the current operation.

In the third and the fourth detecting methods, it is preferable that the calculation of the no-load voltage is carried out when a deviation of the output voltage corresponding to the detected current within predetermined ranges in a charge direction and a discharge direction is within a predetermined variance range.

Furthermore, it is preferable that the predetermined threshold value is determined based on a level of memory effect intended to be judged.

To fulfill the above-stated object, a third method for resolving a memory effect according to the present invention includes the steps of if the battery is judged to have a memory effect according to the third or the fourth memory effect detecting method, calculating an area formed by a variation curve of the no-load voltage versus a residual battery capacity in a normal usage range, and based on a difference between the area and an area formed by a variation curve of the no-load voltage versus a residual battery capacity in the normal usage range when a memory effect does not occur, setting a control range of the residual battery capacity broader than the normal usage range.

To fulfill the above-stated object, a fourth method for resolving a memory effect according to the present invention includes the steps of: if the battery is judged to have a memory effect according to the third or the fourth memory effect detecting method, calculating an area formed by a variation curve of the no-load voltage versus a residual battery capacity in a normal usage range, and based on a difference between the area and an area formed by a variation curve of the no-load voltage versus a residual battery capacity in the normal usage range when a memory effect does not occur, prohibiting correction of a residual battery capacity obtained by the operation based on a voltage variation for a predetermined time period.

According to the above-stated methods, even in the application for HEVs, the generation of the memory effect can be detected easily and accurately while the vehicle is in motion, and the generated memory effect can be resolved easily based on the degree thereof. Therefore, a high energy efficiency can be maintained in a secondary battery system.

DETAILED DESCRIPTION OF THE INVENTION

The following describes preferred embodiments of the present invention, with reference to the drawings.

Embodiment 1

Figure 1:
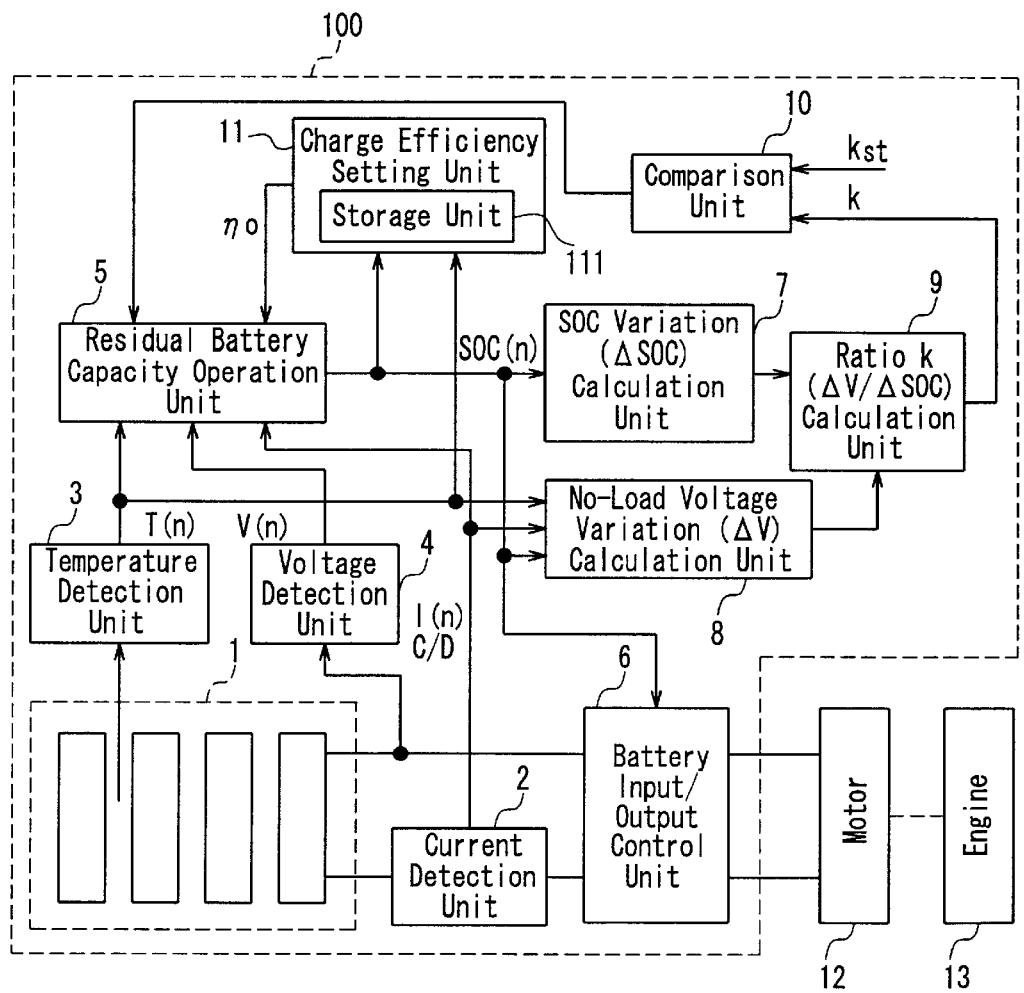
FIG. 1 is a block diagram showing the configuration of a system according to Embodiment 1 of the present invention.

FIG. 1 is a block diagram showing the configuration of a system 100 for detecting the generation of the memory effect and resolving the same according to Embodiment 1 of the present invention.

In FIG. 1, reference numeral 1 denotes a battery pack composed of secondary batteries, such as a Ni-MH battery, which is mounted on a hybrid vehicle. In order to attain a predetermined power for a motor 12, this battery pack 1 is composed of a battery pack including a plurality of battery modules (cells) electrically connected in series, each of the battery modules further including a plurality of single cells that are Ni-MH batteries electrically connected in series. In this embodiment, the battery pack 1 is composed of ten cells that are connected in series and has a capacity of 10 Ah.

Reference numeral 2 denotes a current detection unit that is arranged between a negative output terminal of the battery pack 1 and a negative input terminal of the motor 12. This unit samples a charge/discharge current of the battery pack 1 output from a current sensor (not illustrated) at a predetermined period of time so as to obtain a current sample $I(n)$ to detect a magnitude of the current, and at the same time detect a charge/discharge direction C/D that represents a charge state or a discharge state, depending on its sign.

Reference numeral 3 denotes a temperature detection unit. This unit samples a temperature of the battery output from a temperature sensor (not illustrated) arranged at a predetermined position in the battery pack 1 at a predetermined period of time so as to obtain a temperature sample $T(n)$.

Reference numeral 4 denotes a voltage detection unit. This unit samples an output voltage from the battery pack 1 at a predetermined period of time so as to obtain a voltage sample $V(n)$.

The current sample $I(n)$ and the charge/discharge direction C/D obtained from the current detection unit 2, the temperature sample $T(n)$ obtained from the temperature detection unit 3, and the voltage sample $V(n)$ obtained from the voltage detection unit 4 are supplied to a residual battery capacity (SOC) operation unit 5, where a residual battery capacity $SOC(n)$ in the battery pack 1 is calculated mainly by current integration (current sample $I(n)$·charge efficiency $\eta$). This SOC operation will be described later in detail.

Figure 2A:
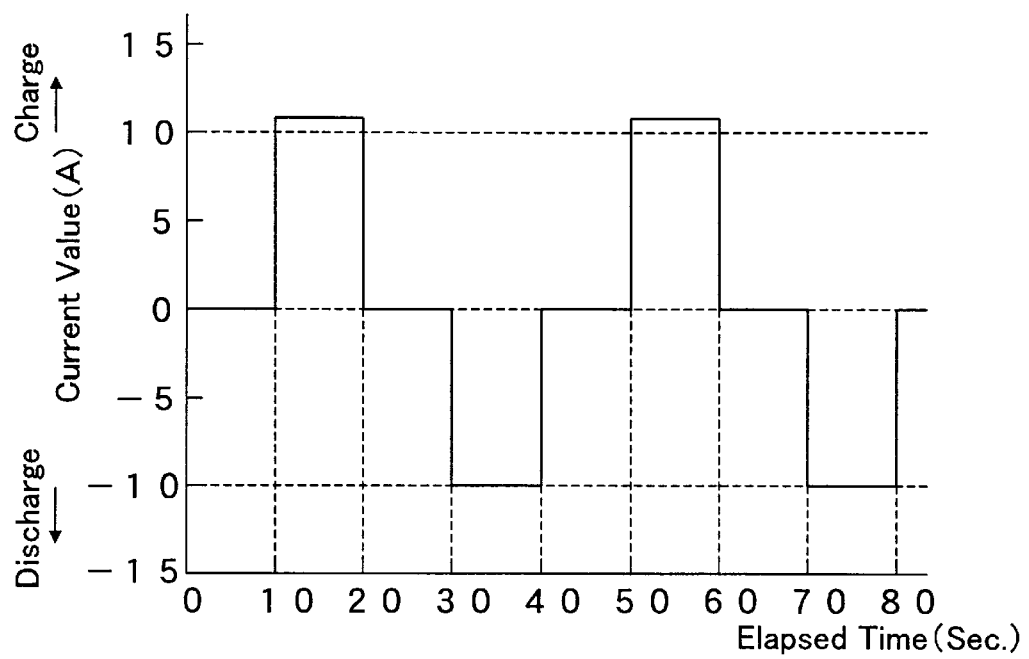
FIG. 2A is a waveform showing a charge excessive pattern by the battery input/output control unit 6 shown in FIG. 1.
Figure 2B:
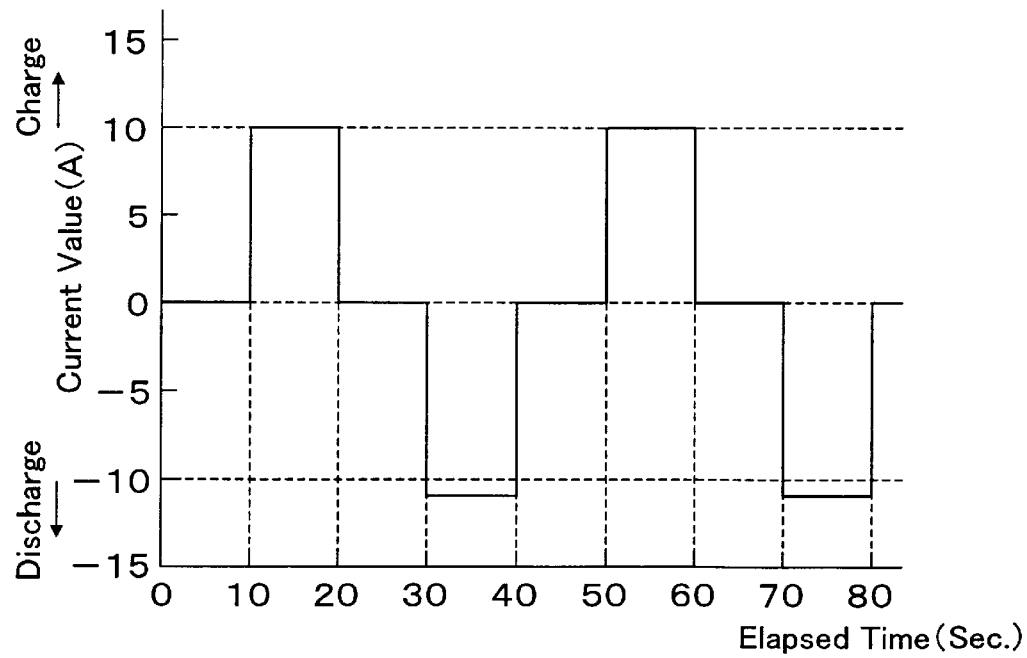
FIG. 2B is a waveform showing a discharge excessive pattern by the battery input/output control unit 6 shown in FIG. 1.

Reference numeral 6 denotes a battery input/output control unit. This unit switches a pattern of charge and discharge with respect to the battery pack 1, based on a current SOC calculated by the residual battery capacity operation unit 5. If a SOC $(n)$ obtained from the residual battery capacity operation unit 5 becomes as low as 50%, which is a lower limit of the control range, then the battery input/output control unit 6 switches into a charge excessive pattern having a charge/discharge current waveform as shown in FIG. 2A. If a $SOC(n)$ obtained from the residual battery capacity operation unit 5 becomes 70%, which is an upper limit of the control range, then the battery input/output control unit 6 switches into a discharge excessive pattern having a charge/discharge current waveform as shown in FIG. 2B.

In addition, the battery input/output control unit 6 controls the amount of charge and discharge with respect to the battery pack 1, in order to perform a power assist operation and a regenerative braking operation of the engine 13 in accordance with a battery input/output request from a driver, such as an acceleration operation and deceleration operation by the driver. In the above operation, if an input/output request from the driver is a battery output request for accelerating the vehicle and climbing a gradient, then the battery input/output control unit 6 charges the battery pack 1 in a short time after the output request is canceled, whereby the voltage of battery that decreased due to the discharge can be increased immediately, which can improve the output performance after that.

Reference numeral 7 denotes a SOC variation calculation unit. This unit calculates a variation $\Delta SOC$ in the residual battery capacity $SOC(n)$ obtained by the operation by the residual battery capacity operation unit 5 for a predetermined time period (e.g., for three minutes).

Reference numeral 8 denotes a no-load voltage variation calculation unit. This unit calculates a variation $\Delta V$ in a no-load voltage Vo for a predetermined time period (e.g., for three minutes), based on the current sample $I(n)$ obtained from the current detection unit 2 and an internal resistance corresponding to the temperature sample $T(n)$ obtained from the temperature detection unit 3 and the residual battery capacity $SOC(n)$ that is calculated currently by the residual battery capacity operation unit 5.

Reference numeral 9 denotes a ratio calculation unit. This unit calculates a ratio $k(=\Delta V/\Delta SOC)$ of the variation $\Delta V$ in the no-load voltage obtained from the no-load voltage variation calculation unit 8 to the variation $\Delta SOC$ in the residual battery capacity obtained from the SOC variation calculation unit 7.

Reference numeral 10 denotes a comparison unit. This unit compares the ratio k obtained from the ratio calculation unit 9 and a threshold value kst that has been set in advance, and outputs a result of the comparison to the residual battery capacity operation unit 5.

Figures 4, 5:
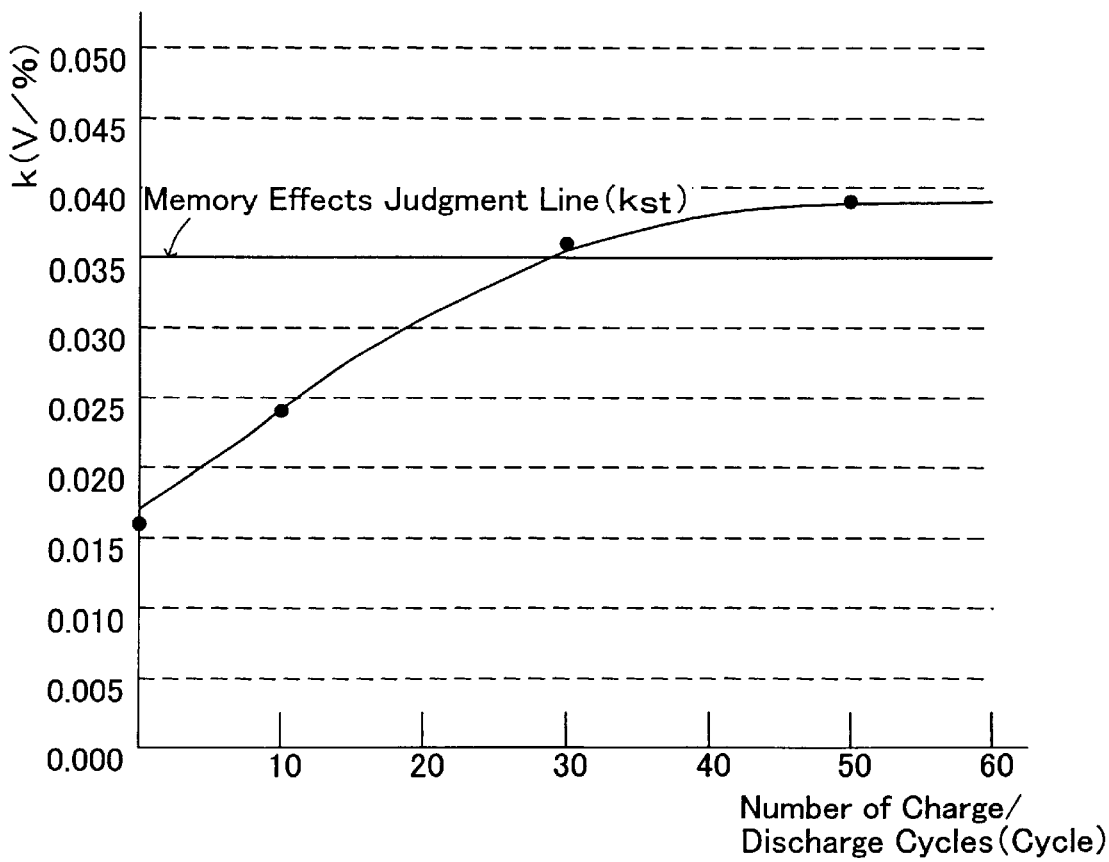
FIG. 4 is a table of charge efficiencies stored in the charge efficiency storage unit 111 in FIG. 1.
FIG. 5 shows a change in a ratio k versus the number of charge/discharge cycles.

Reference numeral 11 denotes a charge efficiency setting unit. As shown in FIG. 4, this unit includes a storage unit 111 that stores a charge efficiency $\eta_0$ that corresponds to a $SOC(n)$ calculated by the residual battery capacity operation unit 5 and a temperature sample $T(n)$. The charge efficiency setting unit 11 refers to the storage unit 111 with regard to a charge efficiency $\eta_0$ corresponding to a residual battery capacity $SOC(n)$ and a temperature sample $T(n)$ and sets the charge efficiency $\eta_0$ with respect to the residual battery capacity operation unit 5. Based on this charge efficiency $\eta_0$, the residual battery capacity operation unit 5 calculates a residual battery capacity $SOC(n)$ by current integration of a current sample $I(n)$ and the charge efficiency $\eta$. Note here that, although FIG. 4 describes only charge efficiencies $\eta_0$ corresponding to specific temperatures and residual battery capacities, charge efficiencies $\eta_0$ corresponding to values between these specific temperatures and between these specific residual battery capacities can be obtained by, for example, interpolation.

Figure 3:
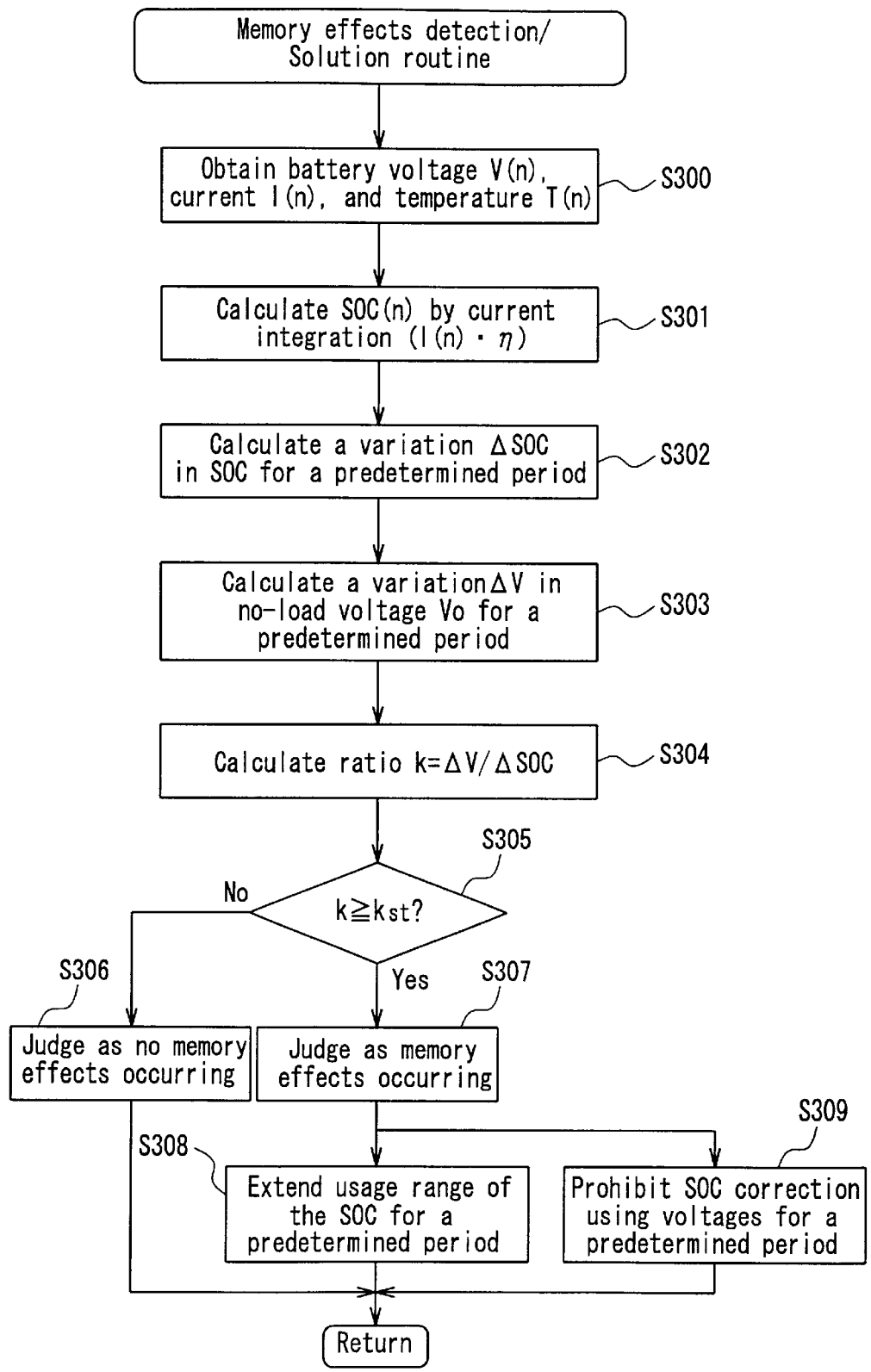
FIG. 3 is a flowchart showing a memory effect detection/solution routine according to Embodiment 1 of the present invention.

The following describes a control process in this embodiment having the above-stated configuration, with reference to FIG. 3.

FIG. 3 is a flowchart showing a memory effect detection/ solution routine according to this embodiment.

First, in FIG. 3, a voltage sample $V(n)$, a current sample $I(n)$, and a temperature sample $T(n)$ of the battery are obtained at a predetermined sampling time period (S300). Based on these obtained voltage sample $V(n)$, current sample $I(n)$, and temperature sample $T(n)$, a residual battery capacity $SOC(n)$ of the battery pack 1 is calculated mainly by current integration of the current sample $I(n)$ and a charge efficiency $\eta_0$ (S301).

Next, a variation $\Delta SOC$ in the residual battery capacity $SOC(n)$ for a predetermined time period, e.g., for three minutes, is calculated (S302). Also, a variation ΔV in the no-load voltage Vo for the same time period, e.g., for three minutes, also is calculated (S303).

Next, a ratio k(=ΔV/ΔSOC) of the variation ΔV in the no-load voltage to the variation ΔSOC in the residual battery capacity calculated in the step S302 is calculated (S304).

Next, a judgment is conducted as to whether the ratio k calculated in the step S304 is not less than the threshold value kst or not (S305). As a result of the judgment, if the ratio k is less than the threshold value kst (No), then the battery is judged not to have a memory effect (S306) and to exit from the routine. Here, in this embodiment, the threshold value kst is set at 0.035.

On the other hand, as a result of the judgment in the step S305, if the ratio k is not less than the threshold value kst (Yes), then the battery is judged to have the memory effect (S307). Note here that a change in the charge/discharge voltage generated on a positive electrode mainly made of nickel hydroxide, which is in general referred to as the memory effect, is ascribable to a change in the no-load voltage Vo and not a change in the internal resistance. Therefore, the generation of the memory effect can be detected according to this method.

Next, in the step S307, if the battery is judged to have the memory effect, then the procedure goes to Steps S308 or S309 so as to resolve the generated memory effect. In the step S308, the usage range of the SOC is extended compared with the normal control range for a predetermined time period. Meanwhile, in the step S309, if the SOC is corrected using voltages, such SOC correction using voltages is prohibited for a predetermined time period. As a result of the above-stated steps S308 and S309, the memory effect can be resolved even when the vehicle is in motion.

The following describes effects obtained from this embodiment, showing an actual specific example.

FIG. 5 shows a state of change in the ratio k versus the number of charge/discharge cycles, when charge is carried out for the battery pack 1 with 12A for thirty minutes and thereafter a cycle of discharge and charge with 12A for twenty minutes is repeated. Note here that this charge operation is carried out while the amount corresponding to the charge efficiency is corrected with a charge current. As a result, charge/discharge was carried out for the battery pack so that the SOC was within a range between 60% and 20%.

As is evident from FIG. 5, the value of the ratio k increases gradually with increasing number of the charge/discharge cycles. Especially, at a region of the SOC becoming closer to 20% that is the smallest level of the SOC, a change in the ratio k becomes remarkable. Further, when the number of the charge/discharge cycles reached 30, the ratio became not less than the threshold value kst (=0.035), which has been set beforehand, so that the generation of the memory effect could be detected.

Figure 6:
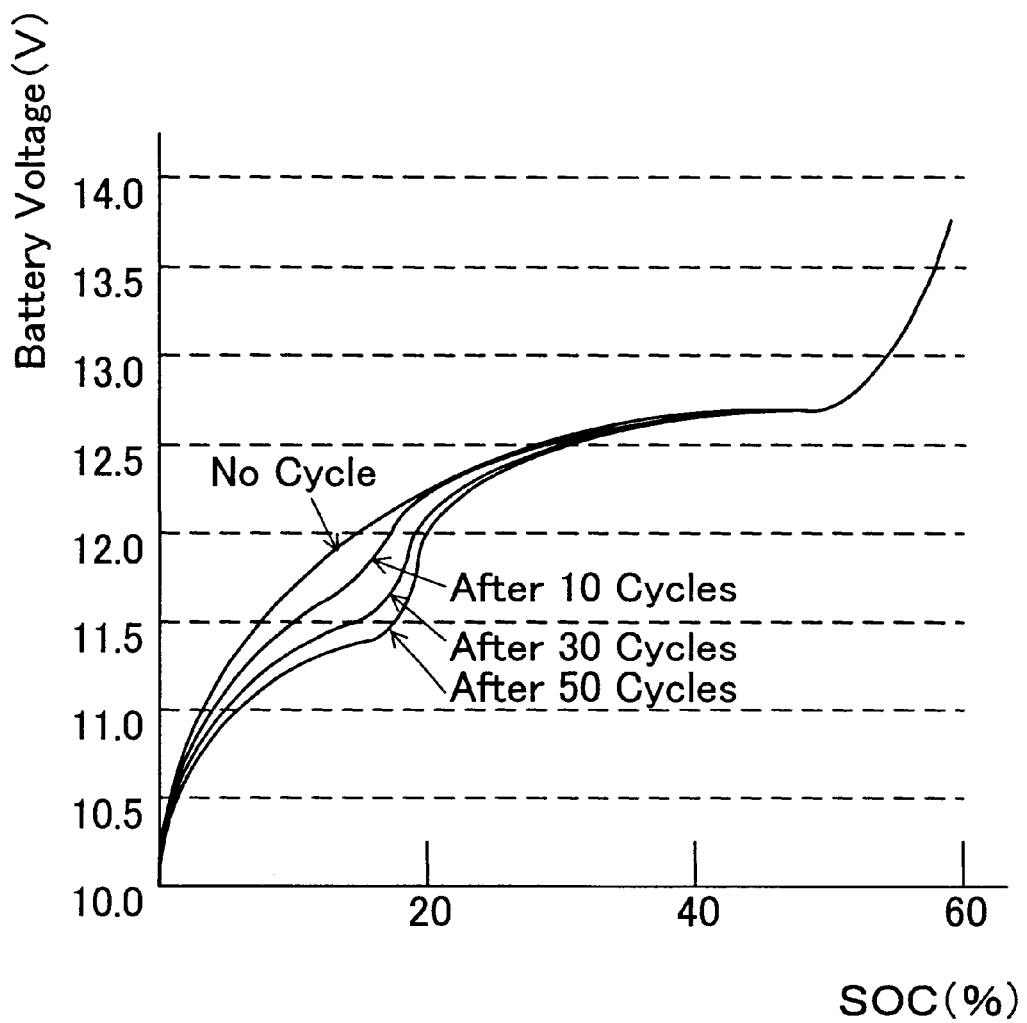
FIG. 6 shows a curve of the voltage versus the SOC, specifying the number of charge/discharge cycles as a parameter.

FIG. 6 shows voltage curves when complete discharge was carried out from the SOC of 60%, after 10, 30, and 50 charge/discharge cycles in the same condition as above were repeated continuously.

As is evident from FIG. 6, at the $10^{th}$ cycle, a voltage variation from the initial state is small, and therefore the degree of the memory effect generated is small. At the $30^{th}$ cycle, a decrease in the discharge voltage is confirmed clearly, and therefore the memory effect occurs. Furthermore, at the $50^{th}$ cycle, the voltage decreases at the same level as the $30^{th}$ cycle, and therefore the generation of the memory effect is saturated substantially.

As stated above, according to this embodiment, it is evident that the generation of the memory effect can be judged accurately.

Note here that although in this embodiment the threshold value kst, which is compared to the ratio k, is set at 0.035, this threshold value kst may be set depending on the level of the memory effect intended to be judged. Also, although the variation ΔSOC in the residual battery capacity is calculated for three minutes, this time period may be set freely based on the operating method for the battery pack 1.

Embodiment 2

Figure 7:
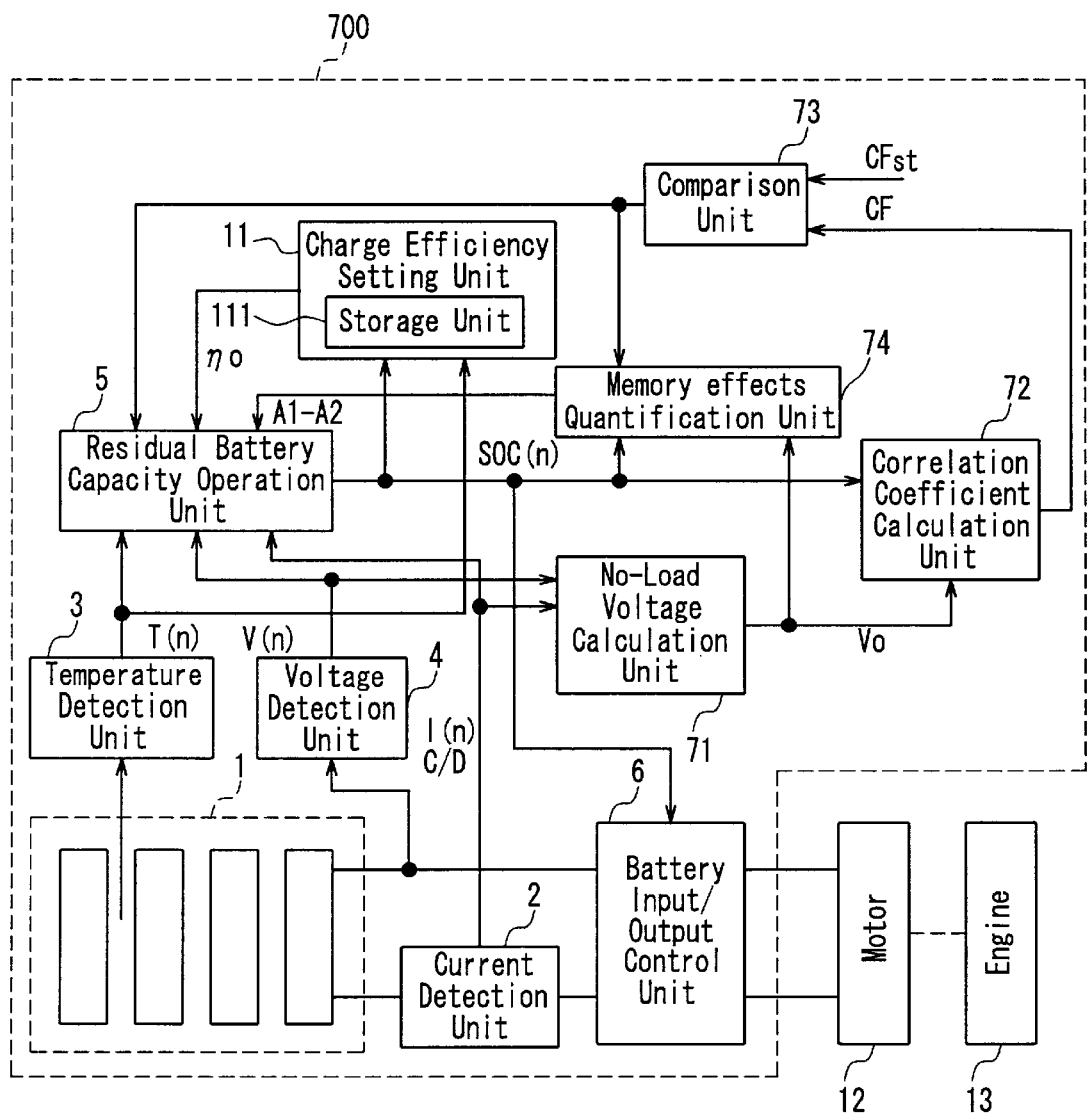
FIG. 7 is a block diagram showing the configuration of a system according to Embodiment 2 of the present invention.

FIG. 7 is a block diagram showing the configuration of a system 700 for detecting generation of the memory effect and resolving the same according to Embodiment 2 of the present invention. Note here that in FIG. 7 construction elements that are the same as those in FIG. 1 have been given the same reference numerals and their explanation has been omitted.

Reference numeral 71 denotes a no-load voltage calculation unit. While the battery pack 1 repeats charge and discharge, this unit associates the voltage sample V(n) obtained from the voltage detection unit 4 with the current sample I(n) and the charge/discharge direction C/D obtained from the current detection unit 2 to store the same, and calculates the voltage at the current being zero as a no-load voltage Vo based on the voltage-current characteristic.

Figure 8:
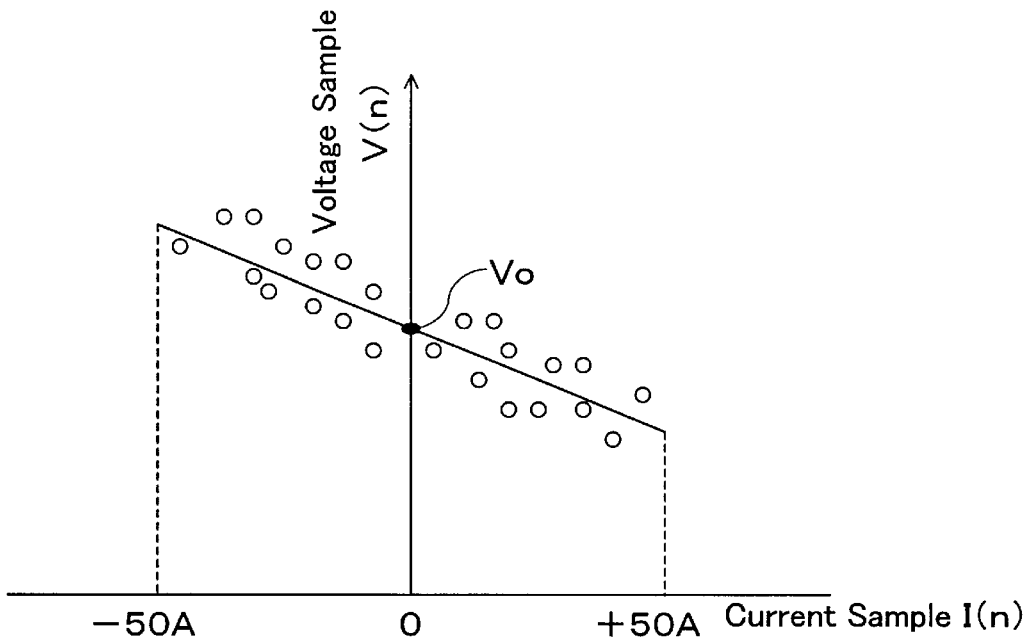
FIG. 8 shows a voltage-current characteristic for explaining a calculation method of the no-load voltage Vo by a no-load voltage calculation unit 71 shown in FIG. 7.

FIG. 8 shows this voltage-current characteristic. In FIG. 8, the horizontal axis represents a current sample I(n) and the vertical axis represents a voltage sample V(n). The positive and negative directions concerning the current sample I(n) represent discharge and charge directions, respectively. As for the conditions of calculating this voltage-current characteristic, for example, the no-load voltage calculation unit 71 obtains a voltage sample V(n) corresponding to a current sample I(n) in the charge current range between 0 to −50A and the discharge current range between 0 to +50A. Then, if the number of the obtained voltage samples V(n) is not less than a predetermined value (e.g., 10 samples for each range) in the above charge and discharge current ranges, and the deviation of these voltage samples V(n) is within a predetermined variance range, then the no-load voltage calculation unit 71 calculates the no-load voltage Vo. This is for the purpose of enhancing the accuracy in calculating the no-load voltage Vo.

Reference numeral 72 denotes a correlation coefficient calculation unit. This unit associates a no-load voltage Vo calculated by the no-load voltage calculation unit 71 with a residual battery capacity SOC(n) obtained from the operation by the residual battery capacity operation unit 5 to store them as a table, for example. With reference to the thus stored no-load voltage Vo corresponding to the residual battery capacity SOC(n), the correlation coefficient calculation unit 72 calculates a correlation coefficient CF among the lower limit SOCl (e.g., 50%) and the upper limit SOCh (e.g., 70%) in the control range of the residual battery capacity and the corresponding lower limit Vol and the upper limit Voh of the no-load voltage. If this correlation coefficient is calculated using the upper and lower limits, the CF is represented by CF=(Vol/SOCl)/(Voh/SOCh).

If the memory effect does not occur, the characteristic of the no-load voltage Vo with respect to the residual battery capacity SOC(n) has linearity substantially in the control range of the residual battery capacity. Therefore, the correlation coefficient CF calculated by the correlation coefficient calculation unit 72 becomes a value close to 1. However, if the memory effect occurs, the linearity of the no-load voltage Vo with respect to the residual battery capacity SOC(n) is decreased based on the degree of the memory effect, so that the correlation coefficient calculated by the correlation coefficient calculation unit 72 becomes closer to 0 from 1.

Through the use of this property, a comparison unit 73 compares the correlation coefficient CF obtained from the correlation coefficient calculation unit 72 with a predetermined threshold value CFst(0<CFst<1). If the correlation coefficient CF is more than the predetermined threshold value CFst, then it is determined that there is no memory effect generated. If the correlation coefficient CF is not more than the predetermined threshold value CFst, then it is determined that the memory effect occurs. Therefore, the comparison unit 73 outputs as such to the residual battery capacity operation unit 5 and a memory effect quantification unit 74, which will be described later. Note here that the predetermined threshold value CFst is set freely based on the level of the memory effect intended to be judged.

Figure 9:
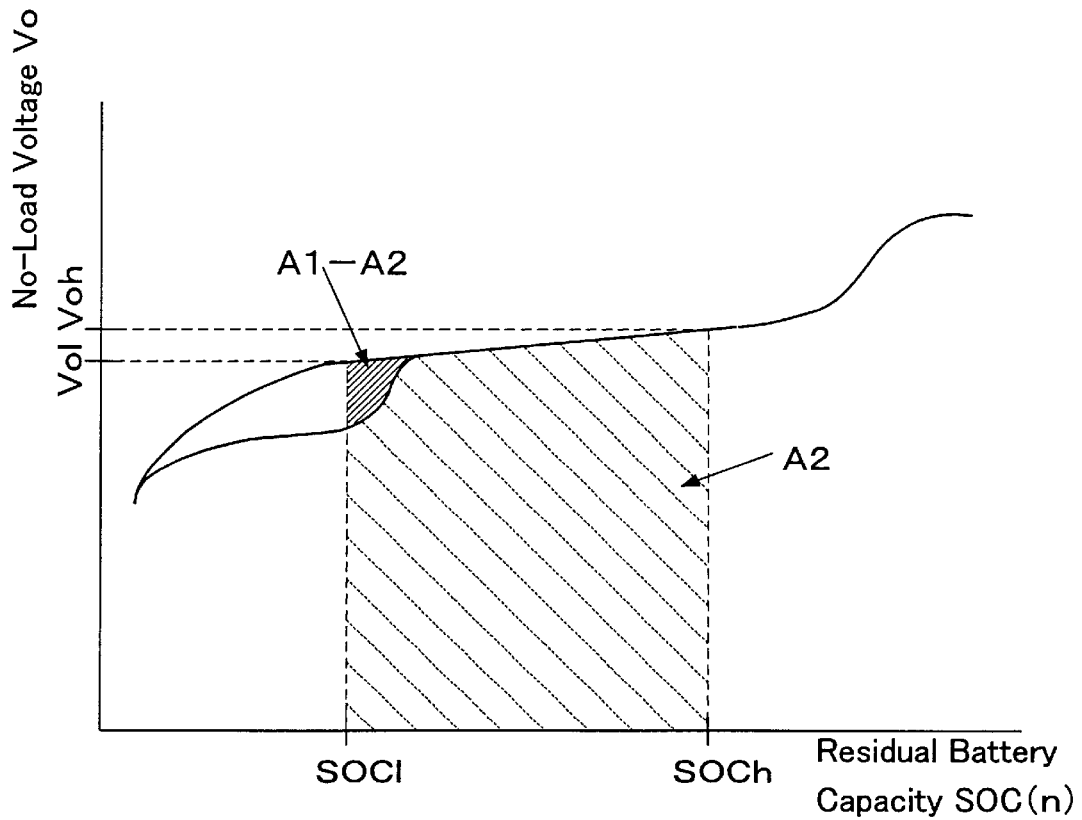
FIG. 9 shows a comparison between the areas of the no-load voltage curve in the control range of the residual batter capacity, which correspond to the absence and the presence of the memory effect, for explaining a quantification method of the memory effect by a memory effect quantification unit 74 shown in FIG. 7.

Reference numeral 74 denotes the memory effect quantification unit. This unit stores beforehand an area A1 formed by the no-load voltage curve (from Vol to Voh) in the control range of the residual battery capacity (from SOCl to SOCh), in the case where the memory effect does not occur. When the comparison unit 73 detects the generation of the memory effect, then the memory effect quantification unit 74 obtains an area A2 formed by the no-load voltage curve in the control range of the residual battery capacity, and calculates a difference between the area A1 and the area A2(A1-A2) so as to quantify the state of the memory effect, and outputs thus quantified degree of the memory effect to the residual battery capacity operation unit 5. FIG. 9 shows a comparison between the areas A1 and A2 formed by the no-load voltage curve in the control range of the residual battery capacity, which correspond to the absence and the presence of the memory effect, respectively.

Figure 10:
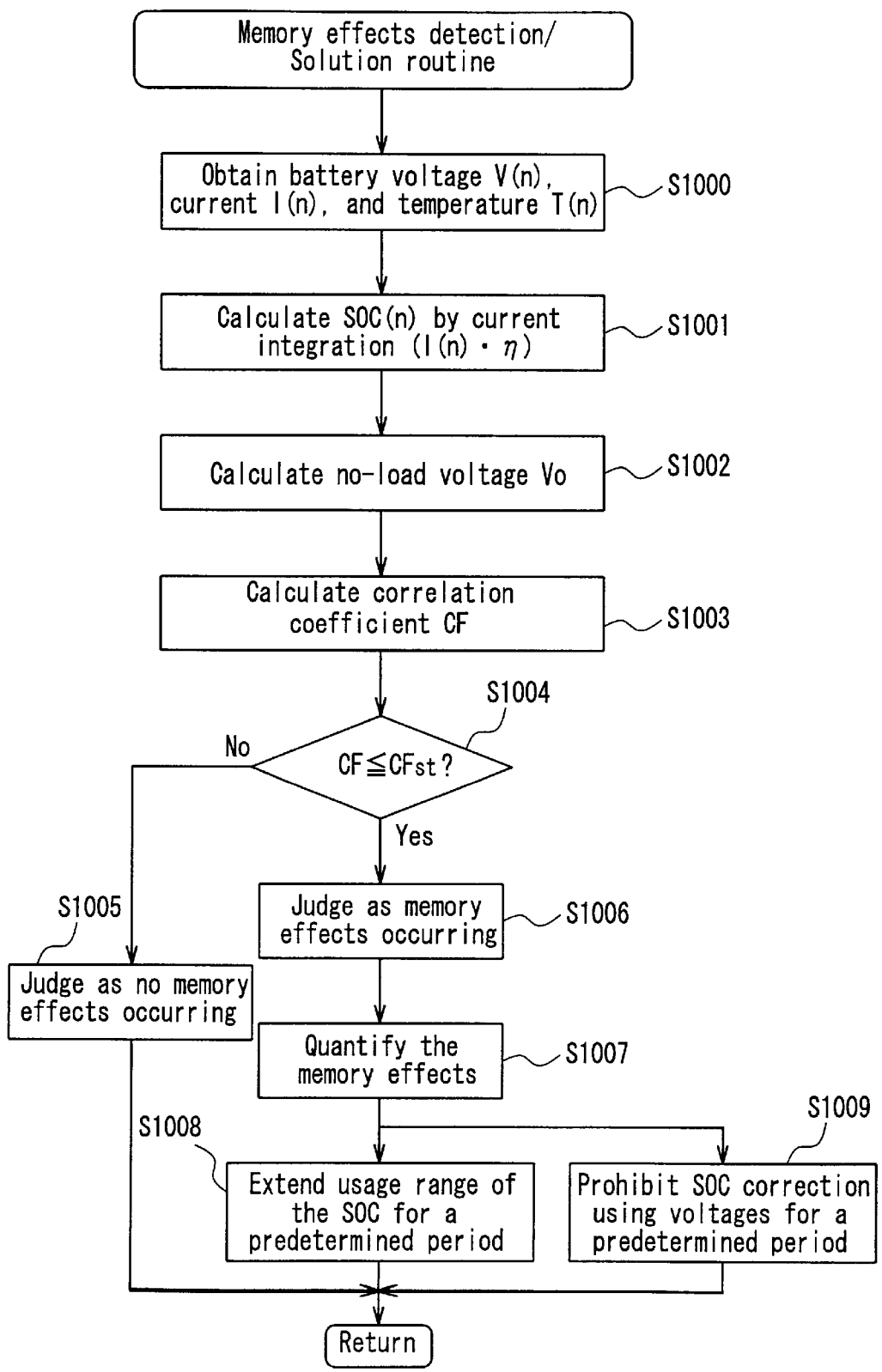
FIG. 10 is a flowchart showing a memory effect detection/solution routine according to Embodiment 2 of the present invention.

The following describes a control process in this embodiment having the above-stated configuration, with reference to FIG. 10.

FIG. 10 is a flowchart showing a memory effect detection/solution routine according to this embodiment.

In FIG. 10, first, a voltage sample V(n), a current sample I(n), and a temperature sample T(n) of the battery are obtained at a predetermined sampling time period while charge and discharge are repeated (S1000). Based on these obtained voltage sample V(n), current sample I(n), and temperature sample T(n), a residual battery capacity SOC(n) of the battery pack 1 is calculated mainly by current integration of the current sample I(n) and a charge efficiency $\eta_0$ (S1001).

Next, if the above-stated conditions for calculation are satisfied, the voltage-current characteristic is obtained based on the table in which voltage samples V(n) corresponding to the current samples I(n) obtained in the step S1000 are stored, and a voltage corresponding to the current being zero in the characteristic is calculated as a no-load voltage Vo (S1002).

Next, the no-load voltage Vo calculated in the step S1002 is associated with the residual battery capacity SOC(n) obtained by the operation in the step S1002 to store them for a predetermined time period. With reference to thus stored no-load voltage Vo corresponding to the residual battery capacity SOC(n), a correlation coefficient CF is calculated among the lower limit SOCl (e.g., 50%) and the upper limit SOCh (e.g., 70%) in the control range of the residual battery capacity and the corresponding lower limit Vol and the upper limit Voh of the no-load voltage (S1003).

Next, a judgment is made as to whether the correlation coefficient CF calculated in the step S1003 is not more than the predetermined threshold value CFst(0<CFst<1) or not (S1004). As a result of the judgment, if the correlation coefficient CF is more than the predetermined threshold value CFst (No), the battery is judged not to have a memory effect (S1005) and to exit from the routine.

On the other hand, as a result of the judgment in the step S1004, if the correlation coefficient is not more than the predetermined threshold value CFst (Yes), the battery is judged to have a memory effect (S1006). In such a case, a difference between the area A1 and area A2 formed by the no-load voltage curve in the control range of the residual battery capacity, which correspond to the absence and the presence of the memory effect, respectively, is calculated, so that the state of the memory effect is quantified (S1007).

Next, the procedure goes to step S1008 or S1009 so as to resolve the memory effect, based on the degree of the memory effect quantified in the step S1007. In the step S1008, the usage range of the SOC is extended compared with the normal control range for a predetermined time period. Meanwhile, in the step S1009, if the SOC is corrected using voltages, such SOC correction using voltages is prohibited for a predetermined time period. As a result of the above-stated steps S1008 and S1009, the memory effect can be resolved based on the degree thereof even when the vehicle is in motion.

Note here that in this embodiment the condition for calculating the no-load voltage Vo includes that ten or more of voltage samples V(n) corresponding to the current samples I(n) are obtained in each of the charge current range between 0 to −50A and the discharge current range between 0 to +50A. However, needless to say, these number and values can be set freely depending on the intended applications.

As stated above, according to the present invention, even in the application for HEVs, the generation of the memory effect can be detected easily and accurately, and the generated memory effect can be resolved easily based on the degree thereof. As a result, a remarkable effect of maintaining a high energy efficiency in a secondary battery system can be obtained.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for detecting a memory effect comprising the steps of:

detecting a current flowing through a secondary battery configured by combining a plurality of single cells into an assembled battery;

performing an operation on a variation in a residual battery capacity for a predetermined time period according to at least current integration by multiplying the detected current by a predetermined charge efficiency;

detecting a temperature of the secondary battery;

calculating a variation in a no-load voltage for the predetermined time period, based on the detected current and an internal resistance corresponding to the detected temperature and the residual battery capacity obtained by the operation;

calculating a ratio of the variation in the no-load voltage to the variation in the residual battery capacity; and if the ratio of the variation in the no-load voltage to the variation in the residual battery capacity is not less than a predetermined threshold value, judging as a memory effect occurring in the secondary battery.

2. The method for detecting a memory effect according to claim 1,
wherein the predetermined charge efficiency is determined based on the detected temperature and the residual battery capacity obtained by the current operation.

3. The method for detecting a memory effect according to claim 1,
wherein the predetermined threshold value is determined based on a level of memory effect intended to be judged.

4. A method for resolving a memory effect detected by a memory effect detecting method that includes the steps of: detecting a current flowing through a secondary battery configured by combining a plurality of single cells into an assembled battery; performing an operation on a variation in a residual battery capacity for a predetermined time period according to at least current integration by multiplying the detected current by a predetermined charge efficiency; detecting a temperature of the secondary battery; calculating a variation in a no-load voltage for the predetermined time period, based on the detected current and an internal resistance corresponding to the detected temperature and the residual battery capacity obtained by the operation; calculating a ratio of the variation in the no-load voltage to the variation in the residual battery capacity; and if the ratio of the variation in the no-load voltage to the variation in the residual battery capacity is not less than a predetermined threshold value, judging as memory effect occurring in the secondary battery,
the method for resolving a memory effect comprising: if the battery is judged to have a memory effect according to the memory effect detecting method, setting a control range of the residual battery capacity broader than a normal usage range.

5. A method for resolving a memory effect detected by a memory effect detecting method that includes the steps of: detecting a current flowing through a secondary battery configured by combining a plurality of single cells into an assembled battery; performing an operation on a variation in a residual battery capacity for a predetermined time period according to at least current integration by multiplying the detected current by a predetermined charge efficiency; detecting a temperature of the secondary battery; calculating a variation in a no-load voltage for the predetermined time period, based on the detected current and an internal resistance corresponding to the detected temperature and the residual battery capacity obtained by the operation; calculating a ratio of the variation in the no-load voltage to the variation in the residual battery capacity; and if the ratio of the variation in the no-load voltage to the variation in the residual battery capacity is not less than a predetermined threshold value, judging as a memory effect occurring in the secondary battery,
the method for resolving a memory effect comprising: if the battery is judged to have a memory effect according to the memory effect detecting method, prohibiting correction of a residual battery capacity obtained by the operation based on a voltage variation for a predetermined time period.

6. A method for detecting a memory effect comprising the steps of:
detecting a current flowing through a secondary battery configured by combining a plurality of single cells into an assembled battery and used in a middle charge state; performing an operation on a variation in a residual battery capacity for a predetermined time period according to at least current integration by multiplying the detected current by a predetermined charge efficiency;
detecting a temperature of the secondary battery;
calculating a variation in a no-load voltage for the predetermined time period, based on the detected current and an internal resistance corresponding to the detected temperature and the residual battery capacity obtained by the operation;
calculating a ratio of the variation in the no-load voltage to the variation in the residual battery capacity; and
if the ratio of the variation in the no-load voltage to the variation in the residual battery capacity is not less than a predetermined threshold value, judging as a memory effect occurring in the secondary battery.

7. The method for detecting a memory effect according to claim 6,
wherein the predetermined charge efficiency is determined based on the detected temperature and the residual battery capacity obtained by the current operation.

8. The method for detecting a memory effect according to claim 6,
wherein the predetermined threshold value is determined based on a level of memory effect intended to be judged.

9. A method for resolving a memory effect detected by a memory effect detecting method that includes the steps of: detecting a current flowing through a secondary battery configured by combining a plurality of single cells into an assembled battery and used in a middle charge state; performing an operation on a variation in a residual battery capacity for a predetermined time period according to at least current integration by multiplying the detected current by a predetermined charge efficiency; detecting a temperature of the secondary battery; calculating a variation in a no-load voltage for the predetermined time period, based on the detected current and an internal resistance corresponding to the detected temperature and the residual battery capacity obtained by the operation; calculating a ratio of the variation in the no-load voltage to the variation in the residual battery capacity; and if the ratio of the variation in the no-load voltage to the variation in the residual battery capacity is not less than a predetermined threshold value, judging as a memory effect occurring in the secondary battery,
the method for resolving a memory effect comprising: if the battery is judged to have a memory effect according to the memory effect detecting method, setting a control range of the residual battery capacity broader than a normal usage range.

10. A method for resolving a memory effect detected by a memory effect detecting method that includes the steps of: detecting a current flowing through a secondary battery configured by combining a plurality of single cells into an assembled battery and used in a middle charge state; performing an operation on a variation in a residual battery capacity for a predetermined time period according to at least current integration by multiplying the detected current by a predetermined charge efficiency; detecting a temperature of the secondary battery; calculating a variation in a no-load voltage for the predetermined time period, based on the detected current and an internal resistance corresponding to the detected temperature and the residual battery capacity obtained by the operation; calculating a ratio of the variation in the no-load voltage to the variation in the residual battery capacity; and if the ratio of the variation in the no-load voltage to the variation in the residual battery capacity is not less than a predetermined threshold value, judging as a memory effect occurring in the secondary battery, the method for resolving a memory effect comprising: if the battery is judged to have a memory effect according to the memory effect detecting method, prohibiting correction of a residual battery capacity obtained by the operation based on a voltage variation for a predetermined time period.

11. A method for detecting a memory effect comprising the steps of:

detecting a current flowing through a secondary battery configured by combining a plurality of single cells into an assembled battery;

detecting an output voltage from the secondary battery while associating the output voltage with the detected current;

calculating a no-load voltage at the detected current being zero, based on a variation in the output voltage with respect to the detected current for a predetermined time period;

performing an operation on a residual battery capacity for the predetermined time period according to at least current integration by multiplying the detected current by a predetermined charge efficiency, based on the calculated no-load voltage;

calculating a correlation coefficient between the no-load voltage and the residual battery capacity obtained by the operation in a predetermined variation range; and if the correlation coefficient is not more than a predetermined threshold value, judging as a memory effect occurring in the secondary battery.

12. The method for detecting a memory effect according to claim 11, wherein a temperature of the secondary battery is detected, and the predetermined charge efficiency is determined based on the detected temperature and the residual battery capacity obtained by the current operation.

13. The method for detecting a memory effect according to claim 11, wherein the calculation of the no-load voltage is carried out when a deviation of the output voltage corresponding to the detected current within predetermined ranges in a charge direction and a discharge direction is within a predetermined variance range.

14. The method for detecting a memory effect according to claim 11, wherein the predetermined threshold value is determined based on a level of memory effect intended to be judged.

15. A method for resolving a memory effect detected by a memory effect detecting method that includes the steps of: detecting a current flowing through a secondary battery configured by combining a plurality of single cells into an assembled battery; detecting an output voltage from the secondary battery while associating the output voltage with the detected current; calculating a no-load voltage at the detected current being zero, based on a variation in the output voltage with respect to the detected current for a predetermined time period; performing an operation on a residual battery capacity for the predetermined time period according to at least current integration by multiplying the detected current by a predetermined charge efficiency, based on the calculated no-load voltage; calculating a correlation coefficient between the no-load voltage and the residual battery capacity obtained by the operation in a predetermined variation range; and if the correlation coefficient is not more than a predetermined threshold value, judging as a memory effect occurring in the secondary battery, the method for resolving a memory effect comprising:
if the battery is judged to have a memory effect according to the memory effect detecting method, calculating an area formed by a variation curve of the no-load voltage versus a residual battery capacity in a normal usage range, and based on a difference between the area and an area formed by a variation curve of the no-load voltage versus a residual battery capacity in the normal usage range when a memory effect does not occur, setting a control range of the residual battery capacity broader than the normal usage range.

16. A method for resolving a memory effect detected by a memory effect detecting method that includes the steps of: detecting a current flowing through a secondary battery configured by combining a plurality of single cells into an assembled battery; detecting an output voltage from the secondary battery while associating the output voltage with the detected current; calculating a no-load voltage at the detected current being zero, based on a variation in the output voltage with respect to the detected current for a predetermined time period; performing an operation on a residual battery capacity for the predetermined time period according to at least current integration by multiplying the detected current by a predetermined charge efficiency, based on the calculated no-load voltage; calculating a correlation coefficient between the no-load voltage and the residual battery capacity obtained by the operation in a predetermined variation range; and if the correlation coefficient is not more than a predetermined threshold value, judging as a memory effect occurring in the secondary battery, the method for resolving a memory effect comprising:
if the battery is judged to have a memory effect according to the memory effect detecting method, calculating an area formed by a variation curve of the no-load voltage versus a residual battery capacity in a normal usage range, and based on a difference between the area and an area formed by a variation curve of the no-load voltage versus a residual battery capacity in the normal usage range when a memory effect does not occur, prohibiting correction of a residual battery capacity obtained by the operation based on a voltage variation for a predetermined time period.

17. A method for detecting a memory effect comprising the steps of:

detecting a current flowing through a secondary battery configured by combining a plurality of single cells into an assembled battery and used in a middle charge state;

detecting an output voltage from the secondary battery while associating the output voltage with the detected current;

calculating a no-load voltage at the detected current being zero, based on a variation in the output voltage with respect to the detected current for a predetermined time period;

performing an operation on a residual battery capacity for the predetermined time period according to at least current integration by multiplying the detected current by a predetermined charge efficiency, based on the calculated no-load voltage;

calculating a correlation coefficient between the no-load voltage and the residual battery capacity obtained by the operation in a predetermined variation range; and if the correlation coefficient is not more than a predetermined threshold value, judging as a memory effect occurring in the secondary battery.

18. The method for detecting a memory effect according to claim 17, wherein a temperature of the secondary battery is detected, and the predetermined charge efficiency is determined based on the detected temperature and the residual battery capacity obtained by the current operation.

19. The method for detecting a memory effect according to claim 17, wherein the calculation of the no-load voltage is carried out when a deviation of the output voltage corresponding to the detected current within predetermined ranges in a charge direction and a discharge direction is within a predetermined variance range.

20. The method for detecting a memory effect according to claim 17, wherein the predetermined threshold value is determined based on a level of memory effect intended to be judged.

21. A method for resolving a memory effect detected by a memory effect detecting method that includes the steps of: detecting a current flowing through a secondary battery configured by combining a plurality of single cells into an assembled battery and used in a middle charge state; detecting an output voltage from the secondary battery while associating the output voltage with the detected current; calculating a no-load voltage at the detected current being zero, based on a variation in the output voltage with respect to the detected current for a predetermined time period; performing an operation on a residual battery capacity for the predetermined time period according to at least current integration by multiplying the detected current by a predetermined charge efficiency, based on the calculated no-load voltage; calculating a correlation coefficient between the no-load voltage and the residual battery capacity obtained by the operation in a predetermined variation range; and if the correlation coefficient is not more than a predetermined threshold value, judging as a memory effect occurring in the secondary battery, the method for resolving a memory effect comprising:

if the battery is judged to have a memory effect according to the memory effect detecting method, calculating an area formed by a variation curve of the no-load voltage versus a residual battery capacity in a normal usage range, and based on a difference between the area and an area formed by a variation curve of the no-load voltage versus a residual battery capacity in the normal usage range when a memory effect does not occur, setting a control range of the residual battery capacity broader than the normal usage range.

22. A method for resolving a memory effect detected by a memory effect detecting method that includes the steps of: detecting a current flowing through a secondary battery configured by combining a plurality of single cells into an assembled battery and used in a middle charged state; detecting an output voltage from the secondary battery while associating the output voltage with the detected current; calculating a no-load voltage at the detected current being zero, based on a variation in the output voltage with respect to the detected current for a predetermined time period; performing an operation on a residual battery capacity for the predetermined time period according to at least current integration by multiplying the detected current by a predetermined charge efficiency, based on the calculated no-load voltage; calculating a correlation coefficient between the no-load voltage and the residual battery capacity obtained by the operation in a predetermined variation range; and if the correlation coefficient is not more than a predetermined threshold value, judging as a memory effect occurring in the secondary battery, the method for resolving a memory effect comprising:

if the battery is judged to have a memory effect according to the memory effect detecting method, calculating an area formed by a variation curve of the no-load voltage versus to a residual battery capacity in a normal usage range, and based on a difference between the area and an area formed by a variation curve of the no-load voltage versus a residual battery capacity in the normal usage range when a memory effect does not occur, prohibiting correction of a residual battery capacity obtained by the operation based on a voltage variation for a predetermined time period.

* * * * *

UNITED STATES PATENT AND TRADEMARK OFFICE
CERTIFICATE OF CORRECTION

PATENT NO. : 6,700,383 B2
DATED : March 2, 2004
INVENTOR(S) : Kimura et al.

It is certified that error appears in the above-identified patent and that said Letters Patent is hereby corrected as shown below:

<u>Title page,</u>
Item [73], Assignee, please add the following:
-- Toyota Jidosha Kabushiki Kaisha, Aichi (JP) --.

Signed and Sealed this

Sixth Day of September, 2005

JON W. DUDAS
*Director of the United States Patent and Trademark Office*